US012025638B1

(12) United States Patent
Gines

(10) Patent No.: US 12,025,638 B1
(45) Date of Patent: Jul. 2, 2024

(54) NOISE REDUCTION OF OSCILLOSCOPE WAVEFORMS

(71) Applicant: Keysight Technologies, Inc., Santa Rosa, CA (US)

(72) Inventor: David L. Gines, Fort Collins, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 112 days.

(21) Appl. No.: 17/944,789

(22) Filed: Sep. 14, 2022

(51) Int. Cl.
*G01R 13/02* (2006.01)

(52) U.S. Cl.
CPC .................................. *G01R 13/02* (2013.01)

(58) Field of Classification Search
CPC ....................................................... G01R 13/02
USPC ............................... 324/76.39, 76.11, 76.21
See application file for complete search history.

(56) References Cited

U.S. PATENT DOCUMENTS

| 8,332,172 | B2 | 12/2012 | Agoston et al. |
| 8,428,192 | B2 | 4/2013 | Ghobrial et al. |
| 10,958,362 | B1* | 3/2021 | Owen ................. H04B 17/364 |
| 2017/0292977 | A1 | 10/2017 | Pickerd et al. |
| 2020/0200821 | A1* | 6/2020 | Freidhof .......... G01R 31/31917 |
| 2021/0405090 | A1* | 12/2021 | Zhao ...................... H04L 1/205 |

\* cited by examiner

*Primary Examiner* — Giovanni Astacio-Oquendo

(57) ABSTRACT

An oscilloscope includes a memory that stores instructions; and a processor that executes the instructions. When executed by the processor, the instructions cause the oscilloscope to obtain a measurement of a first radio frequency signal; perform a first Fourier transform to compute a first new spectrum based on the measurement of the first radio frequency signal; and compute a first waveform of the first new spectrum with noise of the oscilloscope reduced by performing a first inverse Fourier transform based on the first new spectrum.

20 Claims, 10 Drawing Sheets

NOISE REDUCTION OF OSCILLOSCOPE WAVEFORMS

BACKGROUND

Real-time oscilloscopes are used to characterize high-speed digital data. Testing by real-time oscilloscopes is a part of several industry protocols, such as universal serial bus (USB), ethernet or peripheral component interconnect express (PCIe), which rely on data processing algorithms and statistical methods to determine compliance. Acceptable levels of performance, for a wide variety of metrics, are defined in official specifications for industry protocols.

Noise is perhaps the most fundamental metric to be measured. Noise can be divided into two broad categories, waveform noise such as voltage noise/vertical noise, and timing noise such as jitter/horizontal noise. Oscilloscopes which are used to make these measurements have their own source of noise which can corrupt measurements made by the oscilloscopes. As long as the oscilloscope noise is small in comparison to the noise to be measured, this is not a problem. Noise levels to be measured by oscilloscopes are growing increasingly smaller, and therefore oscilloscope noise becomes an increasingly important factor. Without any way to remove the oscilloscope noise, customer devices under test (DUTs) may fail to comply with modern official specifications for industry protocols.

A noise measurement may be represented by a scalar number. For example, when measuring the amount of random jitter on a digital data waveform, the random jitter may be represented by a scalar statistic and oscilloscope noise can be subtracted directly from the digital data waveform. However, the oscilloscope noise must be estimated through a calibration procedure, and if jitter is the desired measurement, the voltage noise/vertical noise of the oscilloscope will need to be converted to jitter/horizontal noise, which also requires measuring the change of voltage over time (i.e., the slew rate) of the data waveform. Additionally, this method assumes the oscilloscope noise is uncorrelated with the noise from the DUT, which is not always true. Moreover, the oscilloscope noise must be much smaller than the noise from the DUT, or else the process is overly sensitive to small errors, and results can vary wildly.

More importantly, not all noise measurements are represented by scalar numbers. For example, simple subtraction is not workable for some representations of noise measurements such as histograms, frequency spectra, time trends, and eye diagrams. Currently, oscilloscope noise is not removed from general waveform data for signals from DUTs. While oscilloscope noise may be removed from jitter trend data, there is not yet any mechanism to remove oscilloscope noise from general waveform data, and even the methods of removing oscilloscope noise from jitter trend data require physically splitting the measured signal for input into two separate channels on the oscilloscope. This can be cumbersome and disruptive to the measurement process at best, simply not possible at worst, and may introduce errors due to cables not being matched, and due to non-ideal connectors.

SUMMARY

According to an aspect of the present disclosure, an oscilloscope includes a memory that stores instructions; and a processor that executes the instructions. When executed by the processor, the instructions cause the oscilloscope to obtain a measurement of a first radio frequency signal; perform a first Fourier transform to compute a first new spectrum based on the measurement of the first radio frequency signal; and compute a first waveform of the first new spectrum with noise of the oscilloscope reduced by performing a first inverse Fourier transform based on the first new spectrum.

According to another aspect of the present disclosure, a tangible non-transitory computer-readable storage medium stores a computer program. The computer program, when executed by a processor, causes a system to: obtain a measurement of a first radio frequency signal; perform a first Fourier transform to compute a first new spectrum based on the measurement of the first radio frequency signal; and compute a first waveform of the first new spectrum with noise of the system reduced by performing a first inverse Fourier transform based on the first new spectrum.

According to another aspect of the present disclosure, a system includes a memory that stores instructions; and a processor that executes the instructions. When executed by the processor, the instructions cause a system to obtain a measurement of a first radio frequency signal; perform a first Fourier transform to compute a first new spectrum based on the measurement of the first radio frequency signal; and compute a first waveform of the first new spectrum with noise of the system reduced by performing a first inverse Fourier transform based on the first new spectrum.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements, components or signals, these elements, components or signals should not be limited by these terms. These terms are only used to distinguish one element, component or signal from another element, component or signal. Thus, a first element, component or signal discussed below could be termed a second element, component or signal without departing from the teachings of the inventive concept(s) described herein.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

The present disclosure, through one or more of its various aspects, embodiments and/or specific features or sub-components, is thus intended to bring out one or more of the advantages as specifically noted below.

As described herein, oscilloscope noise may be removed from a measured waveform from a device under test (DUT), while still leaving the noise from the radio frequency signal from the DUT 10 which is the target of the measurement by the oscilloscope. Results of removing the oscilloscope noise include effectively lowering the noise floor of the oscilloscope through software and improving accuracy of oscilloscope measurements.

Figure 1A:
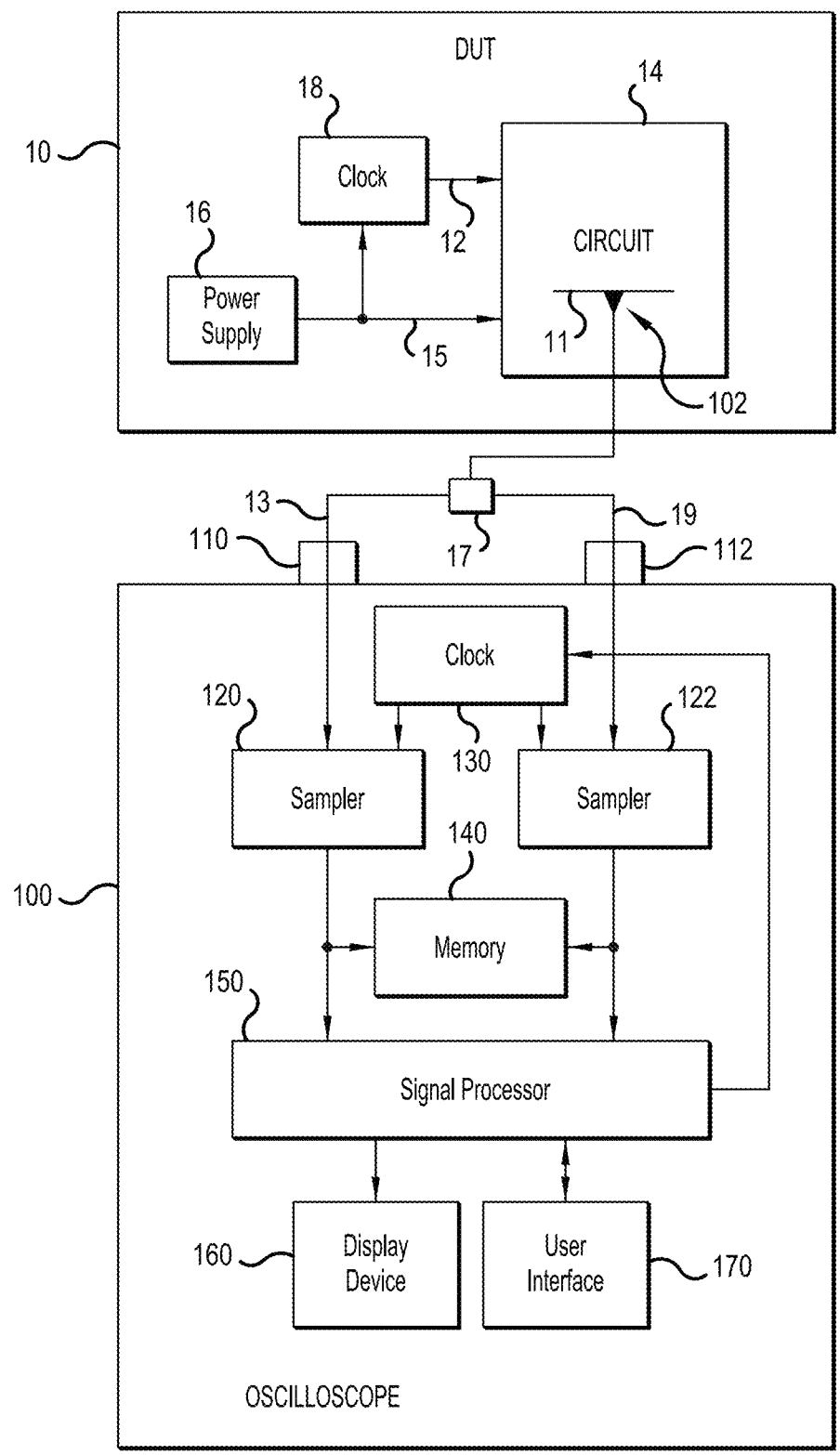
FIG. 1A illustrates a simplified block diagram of a measurement system for noise reduction of oscilloscope waveforms, in accordance with a representative embodiment.

FIG. 1A illustrates a system 100 for improved noise reduction of oscilloscope waveforms, in accordance with a representative embodiment.

The system 100 in FIG. 1A may be used to sample signals from a DUT 10 (device under test). The DUT 10 may be a mobile communication device such as a smartphone, tablet, or mobile computer. The signals from the DUT 10 that are sampled by the system 100 may be radio frequency signals. Here, the DUT 10 is an example and includes an output 11, a circuit 14 that includes the output 11, for example a high speed digital communication circuit, at least one instance of a power supply 16, and at least one instance of a clock 18. The circuit 14 is powered by one or more supply voltages including a first signal 15 produced by power supply 16. Circuit 14 also receives a clock signal 12 from clock 18. The output 11 outputs a signal. The DUT 10 may include multiple different outputs including the output 11, and one or more of such multiple different outputs may each output a different signal.

A power splitter 17 may be a component of the DUT 10, may be separately provided between the DUT 10 and the system 100 as shown, or may be a component of the system 100. The power splitter 17 may receive the signal from the output 11 of the DUT 10 via a probe 102, and split the received signal into a first signal 13 and a second signal 19. The signal from the output 11 may be a radio frequency signal such that the first signal 13 may be a first radio frequency signal and the second signal 19 may be a second radio frequency signal. An indirect connection may occur when the probe 102 is placed in close proximity to the DUT 10 without actually touching a component of the DUT 10, such as when the output 11 is an antenna or antenna array.

In some embodiments, system 100 may be a digital oscilloscope. System 100 may include: a probe 102 that interfaces with the output 11 of the DUT to receive the signal from the output 11; a first input 110 configured to receive (e.g., via a probe 102 and the power splitter 17) the first signal 13 from the DUT 10; a first sampler 120 configured to capture samples of the received supply voltage of the first signal 13; a second input 112 configured to receive (e.g., via the probe 102 and the power splitter 17) the second signal 19 from DUT 10; a second sampler 122 configured to capture samples of the received supply voltage of the second signal 19; memory 140 and a signal processor 150.

The first signal 13 may be a first radio frequency signal, and may be received over a first channel that includes the probe 102, the power splitter 17, the first input 110, and the first sampler 120. The first signal 13 may be carried over one or more wires between the output 11 and the power splitter 17, and between the power splitter 17 and the first input 110. The second signal 19 may be a second radio frequency signal, and may be received over a second channel that includes the probe 102, the power splitter 17, the second input 112, and the second sampler 122. The second signal 19 may be carried over one or more wires between the output 11 and the power splitter 17, and between the power splitter 17 and the second input 112. Although FIG. 1A shows a single instance of the probe 102 interfacing a single instance of the output 11 of the DUT 10 to probe an output signal, the system 100 may include multiple probes each interfacing different individual corresponding instances of such outputs of the DUT 10. For example, different output ports of the DUT 10 may output different signals probed by different probes of the system 100. The output 11 outputs a radio frequency signal. An example of the output 11 is an antenna or antenna array of the DUT 10. In some embodiments, each of first sampler 120 and second sampler 122 may include an analog-to-digital converter (ADC) which may be clocked in response to a clock 130 of the system 100. In some embodiments, only one of the first channel or the second channel are used during active testing of the DUT. In some embodiments, the system 100 only includes the first channel and not the second or any other channel.

System 100 may include a display device 160 and a user interface 170. Display device 160 may include a liquid crystal display (LCD), a plasma display, a cathode ray tube (CRT), etc. User interface 170 may include one or more of: an interactive screen with soft buttons/keys, a keyboard, a keypad, control knobs, a mouse, a trackball, buttons, and/or indicator lights. System 100 may include other components and subsystems not illustrated in FIG. 1A.

Memory 140 may store instructions such as one or more comprehensive computer programs comprising executable instructions and/or individual algorithms comprising executable instructions. The signal processor 150 may process the executable instructions to implement some or all aspects of methods attributed to the system 100 herein. In the system 100, the combination of the memory 140 and the signal processor 150 may be elements of a controller. The memory 140 may also store therein digitized samples of the first signal 13 captured by first sampler 120 and digitized samples of the second signal 19 captured by the second sampler 122. In some embodiments, the digitized samples may be communicated by system 100 via a communications interface (also not shown) to an external device such as a computer where the digitized samples may be processed. The communication interface may be any suitable interface, for example conforming to a standard such as Ethernet. In some embodiments, the communication interface may allow the system 100 to communicate commands and data to one or more external computers and/or other measurement instruments via the Internet.

A controller may include more elements than the memory 140 and the signal processor 150 depicted in FIG. 1A. The memory 140 may include a main memory and/or a static memory, where such memories may communicate with each other via one or more buses. The memory 140 may be implemented by any number, type and combination of random access memory (RAM) and read-only memory (ROM), for example, and may store various types of information, such as software algorithms, which serve as instructions, which when executed by the signal processor 150 cause the signal processor 150 to perform various steps and methods according to the present teachings. Furthermore, updates to the methods and processes described herein may also be stored in the memory 140. The various types of ROM and RAM may include any number, type and combination of computer-readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, Blu-ray disk, a universal serial bus (USB) drive, or any other form of storage medium known in the art. The memory 140 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 140 may be secure and/or encrypted, or unsecure and/or unencrypted. The memory 140 is an example of computer-readable storage media, and should be interpreted as possibly being multiple memories. The memory 140 for instance may be multiple memories local to the system 100. A computer-readable storage medium is defined to be any computer-readable storage medium that constitutes patentable subject matter under 35 U.S.C. § 101 and excludes any computer-readable storage medium that does not constitute patentable subject matter under 35 U.S.C. § 101. Examples of such media include non-transitory media such as computer memory devices that store information in a format that is readable by a computer or data processing system. The signal processor 150 may be implemented by field programmable gate arrays (FPGAs), application specific integrated circuits (ASICs), systems on a chip (SOC), a central processing unit, a computer processor, a microprocessor, a graphics processing unit (GPU), a microcontroller, a state machine, programmable logic device, or combinations thereof, using any combination of hardware, software, firmware, hard-wired logic circuits, or combinations thereof. Additionally, the signal processor 150 is representative of one or more processors, and may include multiple processors, one or more multicore processor(s), parallel processors, and processors of different types. The term "processor" as used herein encompasses an electronic component able to execute a computer program or one or more individual machine executable instruction(s).

The display device 160 may be connected to a controller of the system 100 via a local wired interface. The display device 160 may be interfaced with the user interface 170 and other user input devices by which users can input instructions, including mouses, keyboards, thumbwheels and so on.

A controller of the system 100 may perform some of the operations described herein directly and may implement other operations described herein indirectly. For example, a controller may indirectly control operations such as by generating and transmitting content to be displayed on the display device 160. The controller may directly control other operations such as logical operations performed by the signal processor 150 executing instructions from the memory 140 based on input received from electronic elements and/or users via the interfaces. Accordingly, the processes implemented by the controller when the signal processor 150 executes instructions from the memory 140 may include steps not directly performed by the controller.

Figure 1B:
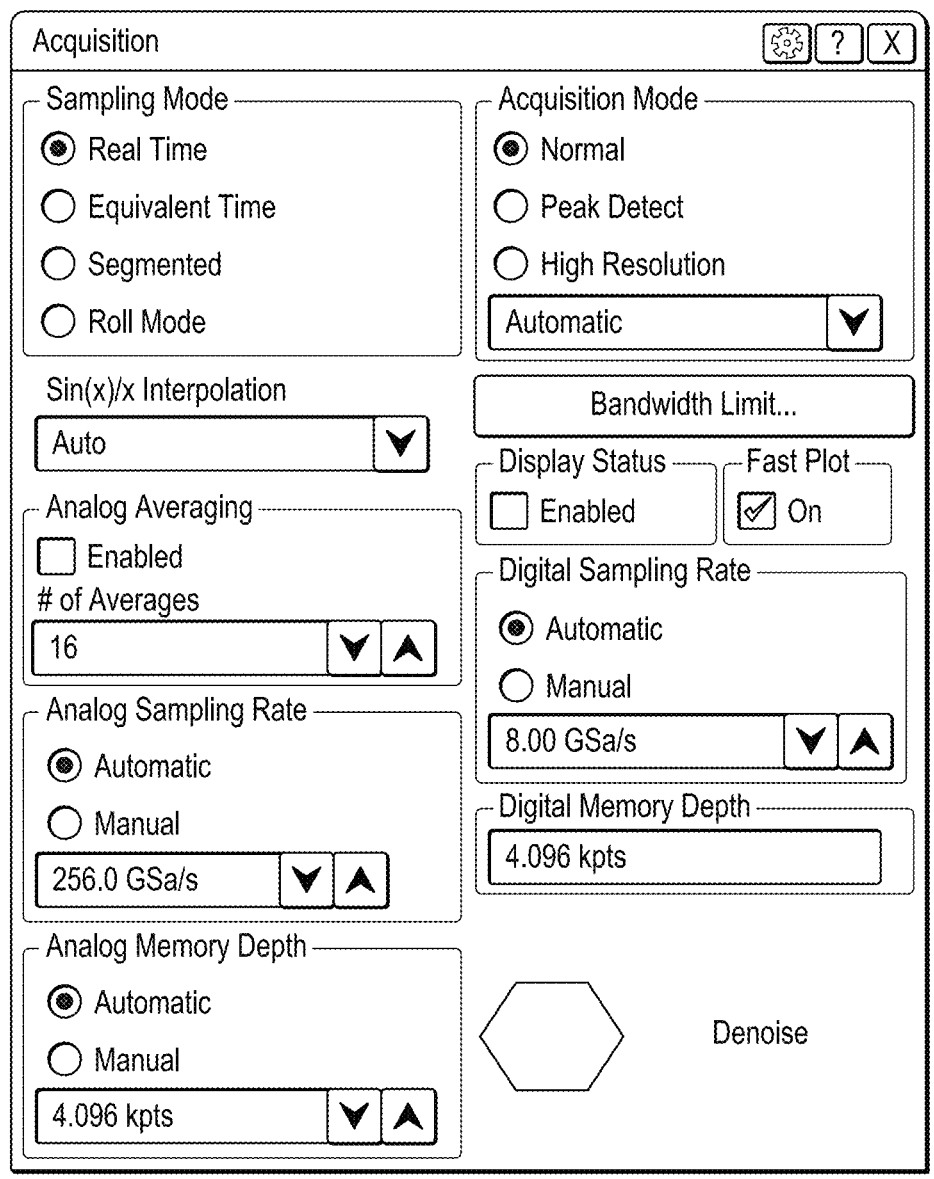
FIG. 1B illustrates a user interface for noise reduction of oscilloscope waveforms, in accordance with a representative embodiment.

FIG. 1B illustrates a user interface for noise reduction of oscilloscope waveforms, in accordance with a representative embodiment.

In FIG. 1B, a user interface 181 is consistent with a user interface that may be displayed on the display device 160 in FIG. 1A. The display device 160 may include a touch screen, and may display selectable options as shown in FIG. 1B via the user interface 181. On the lower right of the user interface 181, a "Denoise" icon may be selectable to instruct the system 100 to reduce oscilloscope noise when performing oscilloscope operations. The reduction of oscilloscope noise is described herein by methods shown in and described with respect to FIG. 2A, FIG. 2B, FIG. 3A and FIG. 3B. The methods of FIG. 2A, FIG. 2B, FIG. 3A and FIG. 3B remove oscilloscope noise from a measured waveform, rather than from a specific measurement such as jitter trends or histograms. Additionally, the removal of oscilloscope noise as described herein leaves noise from the DUT 10 such as noise in radio frequency signals from the DUT as the target of some processes implemented by the system 100.

Figure 2A:
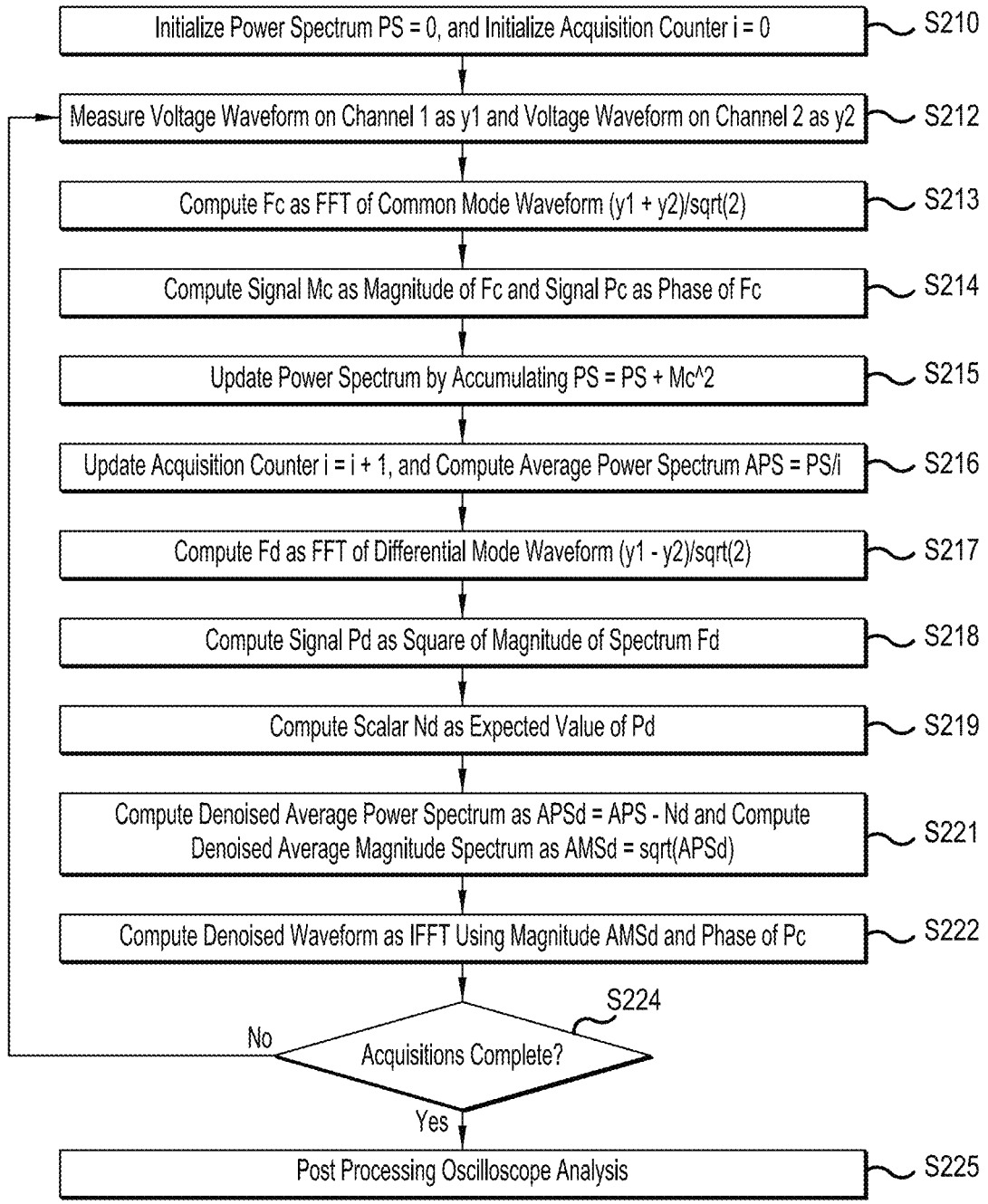
FIG. 2A illustrates a method for noise reduction of oscilloscope waveforms, in accordance with a representative embodiment.

FIG. 2A illustrates a method for noise reduction of oscilloscope waveforms, in accordance with a representative embodiment.

The method of FIG. 2A may be performed by the system 100 in FIG. 1A. The method of FIG. 2A starts at S210 when a power spectrum PS is initialized to 0, and an acquisition counter i is initialized to 0. The power spectrum PS may be initialized to 0 by the system 100 clearing a section of the memory 140 that will be used to store voltage waveform measurements from the first radio frequency signal and the second radio frequency signal from the DUT 10. For example, a section of flash memory may be erased as part of the initialization of the power spectrum PS to 0. The acquisition counter i may be initialized to 0 by clearing a section of the memory 140 that will be used to count acquisitions by the system 100. For example, a register in DRAM may be cleared to set the acquisition counter to 0.

At S212, a voltage waveform is measured on channel 1 as y1 and a voltage waveform is measured on channel 2 as y2. The measured voltage waveform y1 may be a waveform of a first radio frequency signal measured by the oscilloscope on channel 1 and may be equal to y+ys1 where y is the true waveform of the first radio frequency signal from the DUT 10 and ys1 is the random noise generated by the sampling circuitry on channel 1 of the system 100. The measured voltage waveform y2 may be a waveform of a second radio frequency signal measured by the oscilloscope on channel 2 and may be equal to y+ys2 where y is again the true waveform of the second radio frequency signal from the DUT 10 and ys2 is the random noise generated by the sampling circuitry on channel 2 of the system 100. For example, the probe 102 may receive the first radio frequency signal from the DUT 10 and provide the first radio frequency signal to the first sampler 120, and the probe 102 may receive the second radio frequency signal from the DUT 10 and provide the second radio frequency signal to the second sampler 122. The measured voltage waveforms may reflect the waveforms as output by the first sampler 120 and the second sampler 122.

Figure 4:
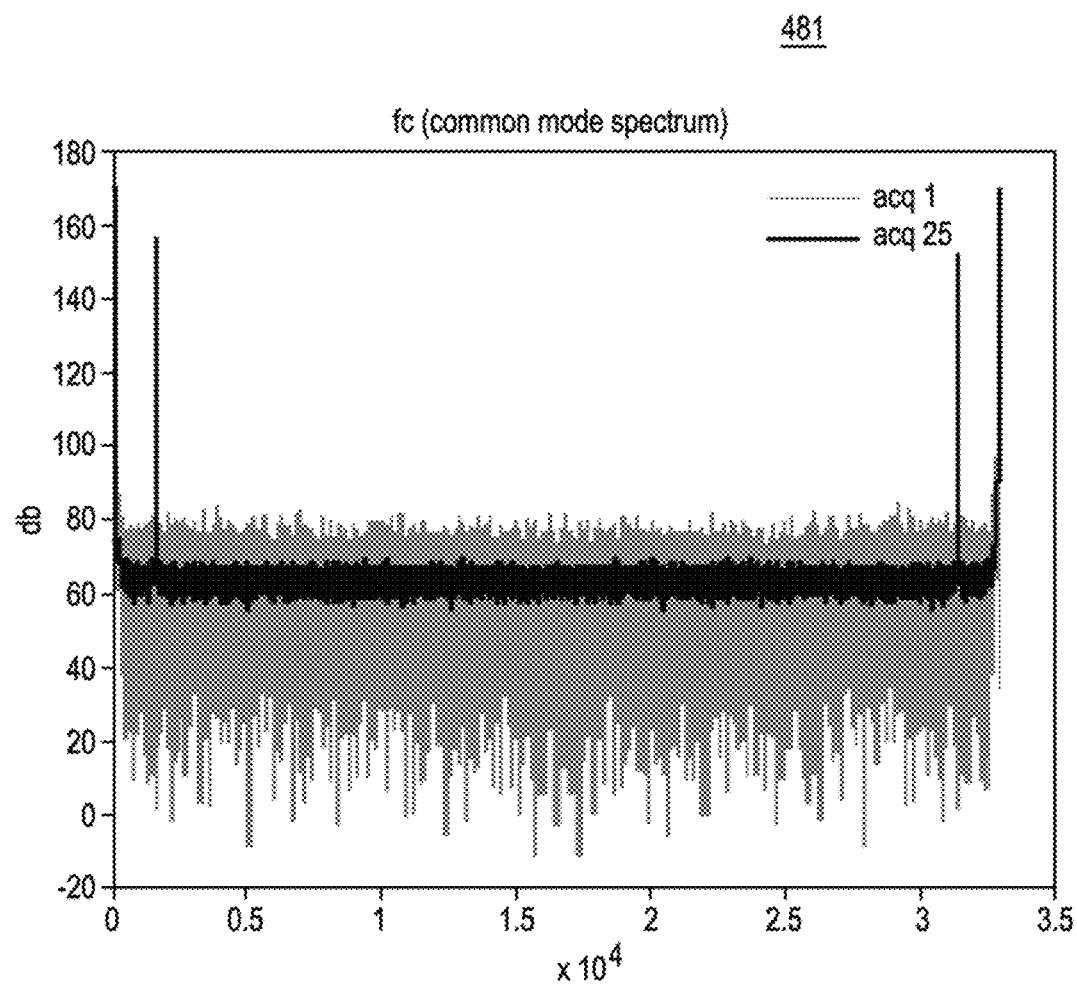
FIG. 4 illustrates comparative spectrums for a common mode signal in noise reduction of oscilloscope waveforms, in accordance with a representative embodiment.

At S213, the frequency spectrum Fc of a common mode waveform yc=(y1+y2)/sqrt(2) is computed as a first Fourier transform. The frequency spectrum Fc may be considered a first new spectrum computed by the system 100 performing a first Fourier transform based on the measurement of y1 as the first radio frequency signal and based on the measurement of y2 as the second radio frequency signal. The Fourier transform may be a fast Fourier transform (FFT), but the teachings herein are not limited to FFTs, and other forms of Fourier transform computations may alternatively be used. The common mode signal yc contains signal components of the first radio frequency signal and the second radio frequency signal from the DUT 10, along with contributions from channel 1 and channel 2 of the system 100. The signal components of the radio frequency signals from the DUT 10 may contain both periodic data and random noise. The frequency spectrum Fc may be computed as the Fourier transform of yc, and the magnitude of this frequency spectrum Fc may be proportional to the frequency content of y, plus noise added by the system 100 such as noise added respectively by the first sampler 120 and the second sampler 122. The spectrum for yc is shown in FIG. 4 and explained later in the context of 1 acquisition and also 25 acquisitions. The spectrum shown in FIG. 4 includes spikes that represent the periodic components in the data of the radio frequency signal from the DUT 10. The noise "floor" is the flat portion of the spectrum for yc and represents noise from both DUT 10 and system 100. The noise spectrum becomes smoother with more acquisitions.

At S214, a signal Mc is computed as the magnitude of the frequency spectrum Fc. Also at S214, the signal Pc is computed as the phase of the frequency spectrum Fc.

At S215, the power spectrum is updated by accumulating PS=PS+Mc^2. That is, the power spectrum is updated for each acquisition, so that the new power spectrum equals the previous power spectrum and the square of Mc calculated for the current iteration at S214. For the first acquisition, the power spectrum PS will be the initial power spectrum.

At S216, the acquisition counter i is updated to i+1. Also at S216, the average power spectrum APS is computed as the power spectrum divided by the current count i of the acquisition counter. For the first acquisition, the APS will simply be the initial power spectrum, whereas for subsequent acquisitions the APS will be an average of the accumulated power spectrum as calculated at S215. For S216, the average power spectrum may be represented as APS=mean(PS(acquisition 1), PS(acquisition 2), PS(acquisition 3), ... ).

At S217, the frequency spectrum Fd of a differential mode waveform yd=(y1−y2)/sqrt(2) is computed as a second Fourier transform. Again, the Fourier transform may be a fast Fourier transform (FFT), but the teachings herein are not limited to FFTs, and other forms of Fourier transform computations may alternatively be used. The system 100 in FIG. 1A may be an oscilloscope and may be configured to measure a contribution of the oscilloscope to noise of the first common mode signal computed at S213 by performing the second Fourier transform of a differential mode signal at S217. The second Fourier transform performed at S217 is based on the first radio frequency signal from the DUT 10 and the second radio frequency signal from the DUT 10. The differential mode signal yd only contains noise contributions from the oscilloscope and Fd is the Fourier transform of yd. The magnitude of Fd is proportional only to combined oscilloscope noise, Nd.

Figure 5:
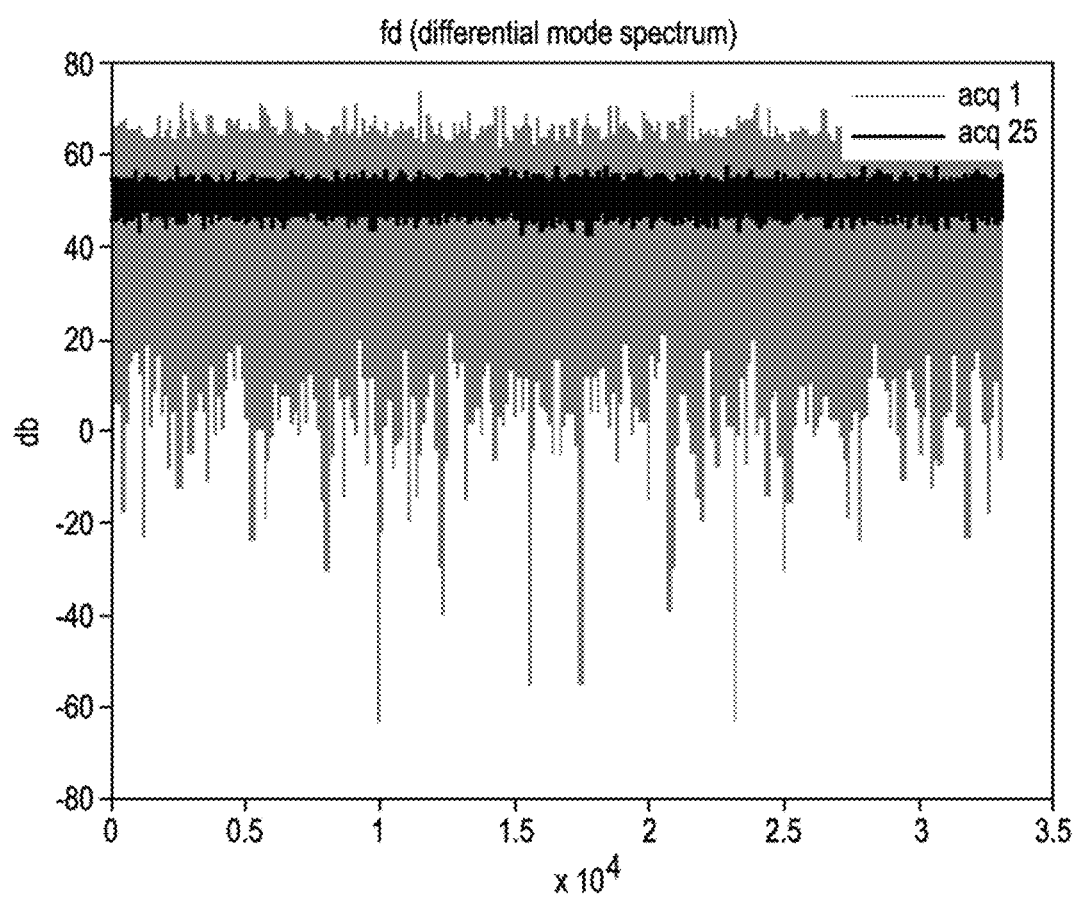
FIG. 5 illustrates comparative spectrums for a differential mode signal in noise reduction of oscilloscope waveforms, in accordance with a representative embodiment.

At S218, the combined oscilloscope noise power spectrum Pd is computed as the square of the magnitude of the frequency spectrum Fd. At S219, the scalar Nd is computed as an expected value of Pd. The expected value Nd may be any scalar measure of the spectrum for noise, such as the mean value, a weighted mean value, or median value. An example of the power spectrum Pd is shown in FIG. 5. FIG. 5 shows an example of the power spectrum Pd for yd after 1 acquisition, and again after 25 acquisitions.

At S221, the denoised average power spectrum is computed as APSd=APS−Nd, and the denoised average magnitude spectrum is computed as AMSd=sqrt(APSd). Although the term "denoised" is used herein, the noise reduction achieved for embodiments herein may not always be a complete reduction in noise. Instead, the noise removed from signals is the noise attributable to the system 100, as noise in signals from the DUT 10 should remain after the process of FIG. 2A and other processes described herein.

Figure 6:
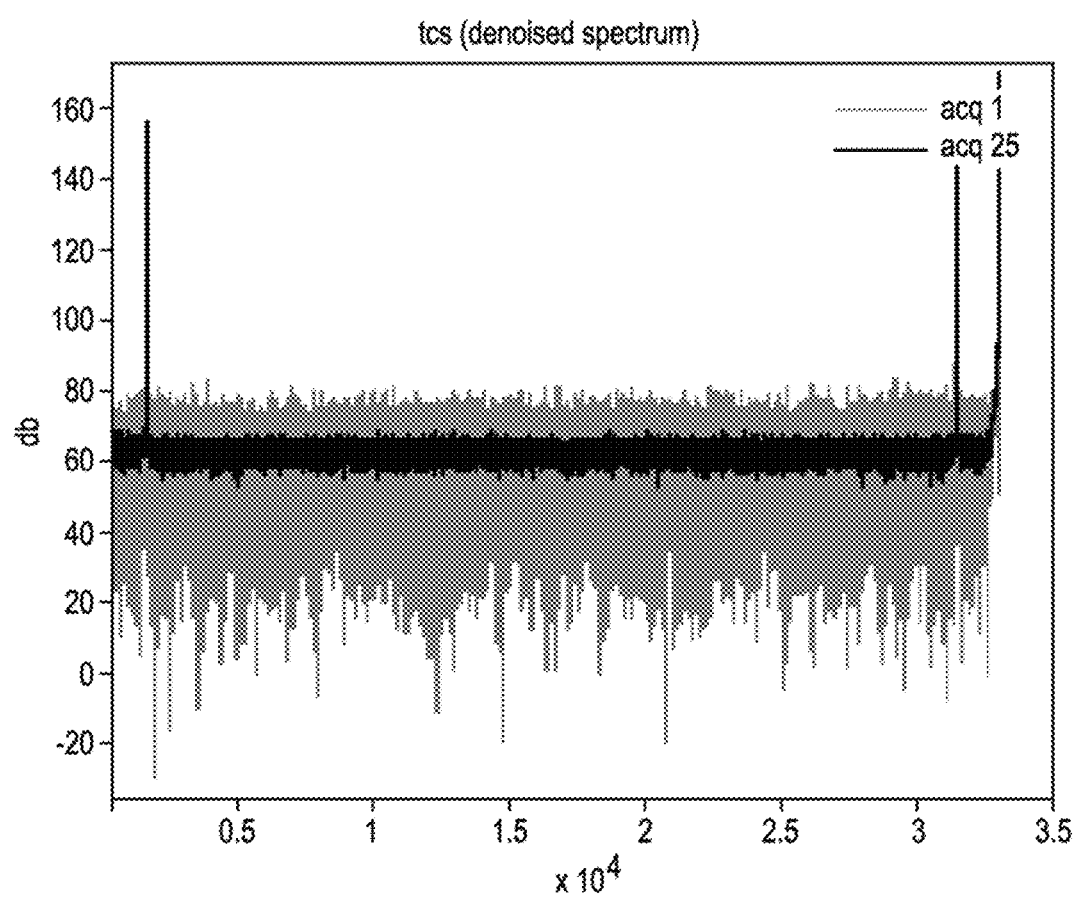
FIG. 6 illustrates a noise-reduced spectrum in noise reduction of oscilloscope waveforms, in accordance with a representative embodiment.

For S221, the combined oscilloscope noise Nd may be obtained by measuring the magnitude of the noise power spectrum, Pd, and then removing the oscilloscope noise Nd by simply subtracting Nd from the first average power spectrum, APS. In other words, a new power spectrum, APSd=APS−Nd may be formed. As shown in FIG. 6, this explicitly lowers the "noise floor" of APS, and the new power spectrum APSd has reduced oscilloscope noise.

At S222, the denoised waveform is computed as an inverse Fourier transform using the magnitude AMSd, where AMSd is the square root of the denoised average power spectrum APSd, and the phase Pc. The inverse Fourier transform may be an inverse fast Fourier transform (IFFT), but the teachings herein are not limited to IFFTs, and other forms of inverse Fourier transform computations may alternatively be used. The system 100 in FIG. 1A may be an oscilloscope and may be configured to compute a first waveform of the first new spectrum with noise of the oscilloscope reduced by performing the inverse Fourier transform as a first inverse Fourier transform based on the first new spectrum.

For S222, to recover the waveform of the first radio frequency signal from the DUT 10 back in the time domain, the phase component from the most recent acquisition may be combined with the magnitude of the averaged power spectrum in the inverse FFT, to return to the time domain. The denoised waveform ys may be computed as the IFFT (AMSd, phase(Fc)). This reconstructs a version of the waveform of the first radio frequency signal from the DUT 10 without corruption by noise added by the oscilloscope.

At S224, a determination is made as to whether acquisitions are complete. If acquisitions by the system 100 are not complete (S224=No), the process returns to S212, such as after updating the acquisition counter and again computing the average power spectrum as at S216. The oscilloscope noise may be increasingly reduced as more data is added, insofar as the power spectrum PS is computed on each new acquisition and then averaged with power spectra from previous acquisitions.

If acquisitions by the system 100 are complete (S224=Yes), post processing oscilloscope analysis is performed at S225. In other words, the system 100 may be an oscilloscope, and the method of FIG. 2 through S225 may be performed as pre-processing for other oscilloscope functions, such as other oscilloscope functions requested by a user using the user interface 181 in FIG. 1B. While the resultant measured waveform may be described as being denoised, the noise removed is the noise of the measurement system and not the noise of the DUT 10. Denoised waveforms may be plotted or used as input to an analysis algorithm, including jitter trends and histograms, eye diagrams, crosstalk analysis, power fidelity or any other analysis package.

Figure 2B:
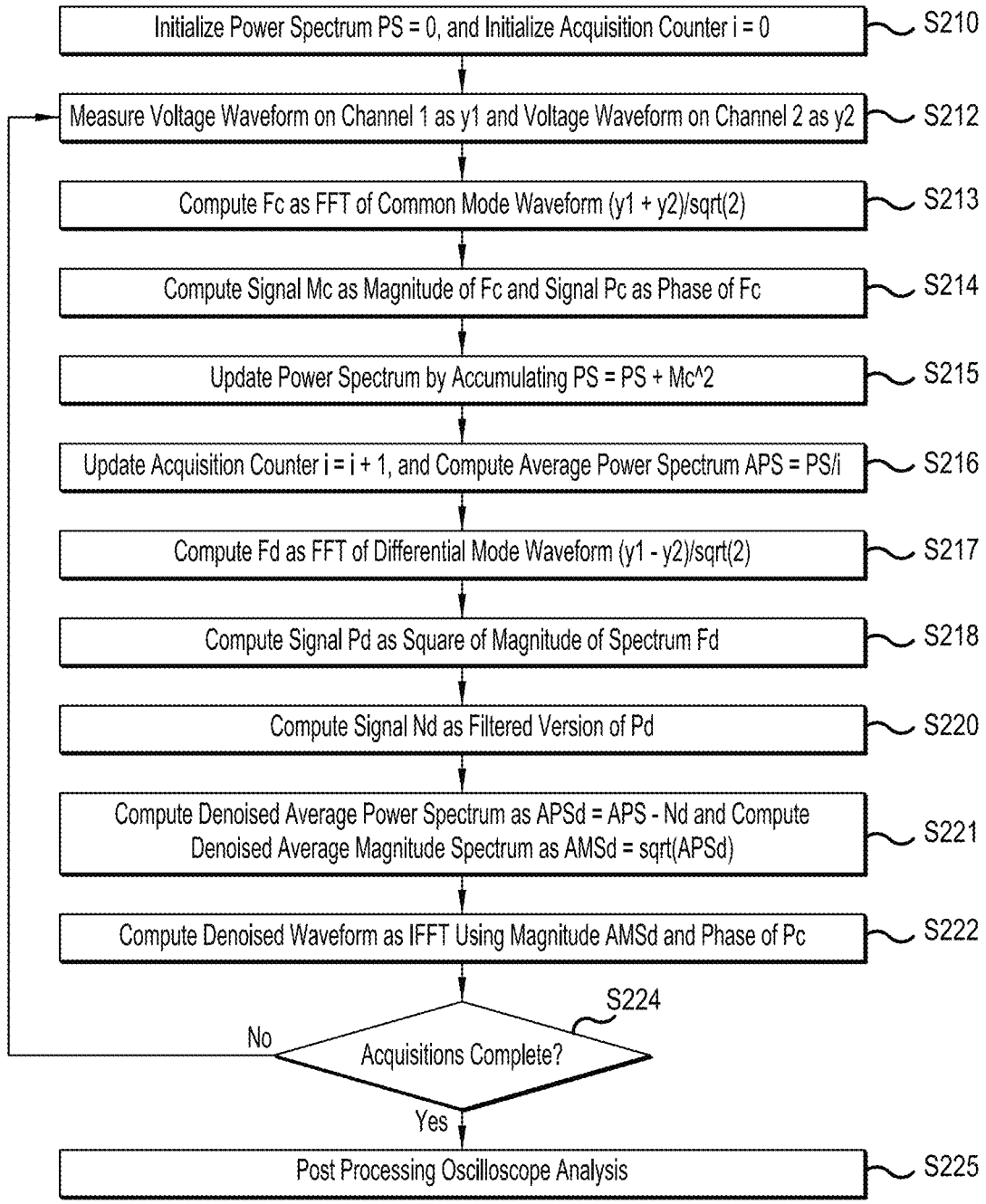
FIG. 2B illustrates a method for noise reduction of oscilloscope waveforms, in accordance with a representative embodiment.

FIG. 2B illustrates a method for noise reduction of oscilloscope waveforms, in accordance with a representative embodiment. The method of FIG. 2B is similar to the method of FIG. 2A, and overlapping features are not always repeated for the save of brevity. The method of FIG. 2B may be performed by the system 100 in FIG. 1A.

The method of FIG. 2B starts with initializing the power spectrum PS to 0 and the acquisition counter i to 0 at S210. The method of FIG. 2B also ends at S225 with post processing oscilloscope analysis. However, instead of computing the scalar Nd as an expected value of Pd at S219 as in FIG. 2A, at S220 the signal Nd is computed as a filtered version of Pd. The filtered version may be obtained by a trend-preserving vector approximation, such as by a low pass filter, median filter, or curve fit to filter out spurious components of Pd, or Pd may be used directly in which case Nd=Pd.

At S221, the denoised average power spectrum is again computed as APSd=APS−Nd, wherein Nd is now the signal Nd computed as a filtered version of Pd. The process of FIG. 2B otherwise includes the same steps as in FIG. 2A from S221 to S225.

In embodiments based on FIG. 2A and/or FIG. 2B, channel data may be combined in common mode and differential mode to increase the rate of convergence of the noise reduction, or in other words, to removes noise faster. The approach of FIG. 2A and FIG. 2B may also be generalized to more than 2 channels, such as 4 channels, for even faster convergence. The methods of FIG. 2A and FIG. 2B also return an estimate of the oscilloscope noise as represented by the magnitude of Nd.

In simulations and measurements, the methods of FIG. 2A and FIG. 2B are shown to converge quickly because the common mode signal yc=y1+y2, is already averaging out some of the oscilloscope noise, even before beginning a cross correlation algorithm, since noise from channel 1 and channel 2 are uncorrelated.

Figure 3A:
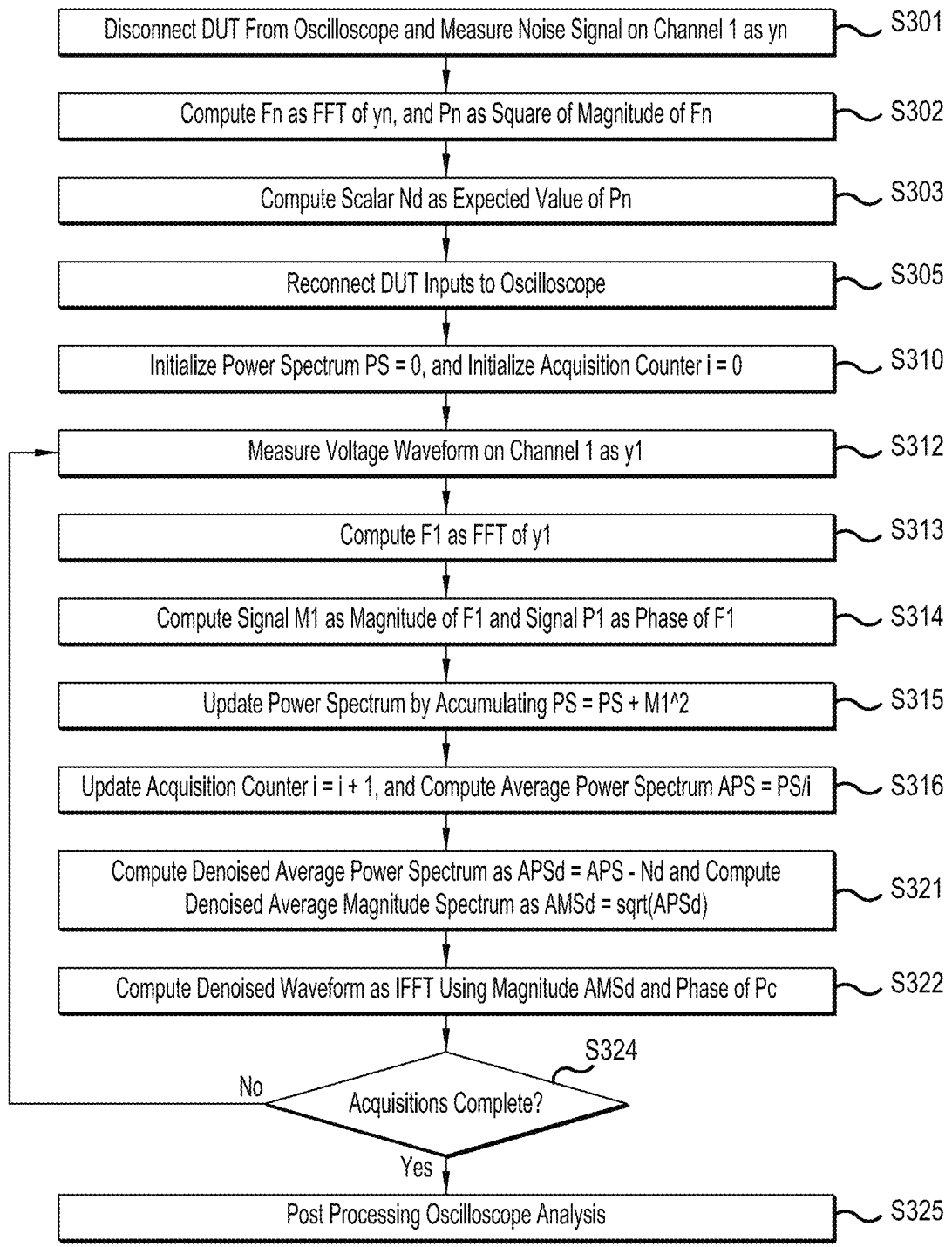
FIG. 3A illustrates a method for noise reduction of oscilloscope waveforms, in accordance with a representative embodiment.

FIG. 3A illustrates a method for noise reduction of oscilloscope waveforms, in accordance with a representative embodiment.

The method of FIG. 3A may be performed by the system 100 in FIG. 1A. In this embodiment, however, the power splitter is removed, and the DUT 10 is connected directly to the oscilloscope at 110, which may be referred to by example as channel 1. At S301, a DUT is disconnected from an oscilloscope and a noise signal is measured on channel 1 as yn by sampling the voltage at 110 using first sampler 120. For example, the system 100 in FIG. 1A may comprise an oscilloscope, and the DUT 10 may be disconnected from the oscilloscope at S301. The DUT may comprise a mobile communication device such as a smartphone, table or laptop computer.

At S302, the frequency spectrum Fn is computed for the noise signal yn. The frequency spectrum Fn may be the frequency spectrum for the noise signal yn in a first radio frequency signal and computed as a first Fourier transform. The frequency spectrum Fn may be considered a first new spectrum computed by the system 100 performing a first Fourier transform based on the measurement of yn as the first radio frequency. The Fourier transform may be a fast Fourier transform (FFT), but the teachings herein are not limited to FFTs, and other forms of Fourier transform computations may alternatively be used. The power spectrum Pn is computed as the square of the magnitude of spectrum Fn.

At S303, the scalar Nd is computed as the expected value of the noise power Pn of the oscilloscope. The expected value Nd may be any scalar measure of the spectrum for noise, such as the mean value, a weighted mean value, or median value.

At S305, the DUT 10 is reconnected to the inputs of the system. For example, the probe 102 in FIG. 1A may be reconnected to components of the DUT 10, though the connection may be direct or indirect. An indirect connection may occur when the probe 102 is placed in close proximity to the DUT 10 without actually touching a component of the DUT 10, such as when the output 11 is an antenna or antenna array.

At S310, the power spectrum PS is initialized to 0, and the acquisition counter i is initialized to 0. The power spectrum PS may be initialized to 0 by the system 100 clearing a memory such as a flash memory that will be used to store voltage waveform measurements from the first radio frequency signal from the DUT 10. The acquisition counter i may be initialized to 0 by clearing a memory such as a DRAM memory that will be used to count acquisitions by the system 100.

At S312, a voltage waveform on channel 1 is measured as y1. The measured voltage waveform of y1 may be for a second radio frequency signal. Notably, S312 may be performed in the absence of a channel 2 or otherwise without using a channel 2.

At S313, the frequency spectrum F1 of the voltage waveform y1 is computed as a Fourier transform. The frequency spectrum F1 may be considered a second new spectrum computed by the system 100 performing a first Fourier transform based on the measurement of y1 as the first radio frequency signal. The frequency spectrum F1 in embodiments based on FIG. 3A may be a first new spectrum computed based on the measurement of the first radio frequency signal at S312.

At S314, the signal M1 is computed as the magnitude of F1 and the signal P1 is computed as the phase of F1.

At S315, the power spectrum PS is updated by accumulating PS=PS+M1^2. The average power spectrum APS is simply M1 for the first acquisition, but will reflect an average of multiple acquisitions after the first acquisition and after the first iteration of the method of FIG. 3A.

At S316, the acquisition counter i is updated to i+1, and the average power spectrum APS is computed as the power spectrum divided by the current count i of the acquisition counter.

At S321, the denoised average power spectrum is computed as APSd=APS−Nd, and the denoised average magnitude spectrum is computed as AMSd=sqrt(APSd). That is, the scalar Nd computed at S303 as the estimated contribution of the oscilloscope noise of the first radio frequency signal is removed from the average power spectrum APS computed at S316.

As a reminder, although the term "denoised" is used herein, the noise reduction achieved for embodiments herein may not always be a complete reduction in noise. Instead, the noise removed from signals is the noise attributable to the system 100, as noise in signals from the DUT 10 should remain after the process of FIG. 3A and other processes described herein.

At S322, the denoised waveform is computed as an inverse Fourier transform using the magnitude AMSd and the phase of Pc. The denoised waveform computed at S322 may be a first waveform with noise of the oscilloscope reduced by performing the first inverse Fourier transform based on the first new spectrum computed at S313 and the estimated contribution of the oscilloscope Nd to the noise of the first radio frequency signal subtracted at S321.

For S322, to recover the waveform of the first radio frequency signal from the DUT 10 back in the time domain, the phase component from the most recent acquisition may be combined with the magnitude of the averaged spectrum in the inverse FFT, to return to the time domain. The denoised waveform ys may be computed as the IFFT (AMSd, phase(F1)). This reconstructs a version of the waveform of the first radio frequency signal from the DUT without noise from the oscilloscope.

At S324, a determination is made as to whether acquisitions are complete. If acquisitions by the system 100 are not complete (S324=No), the process returns to S312, such as after updating the acquisition counter and again computing the average power spectrum as at S316. The oscilloscope noise may be increasingly reduced as more data is added, insofar as the power spectrum PS is computed on each new acquisition and then averaged with power spectra from previous acquisitions.

If acquisitions by the system 100 are complete (S324=Yes), post processing oscilloscope analysis is performed at S325. Again, while the resultant measured waveform may be described as being denoised, the noise removed is the noise of the measurement system and not the noise of the DUT 10. Denoised waveforms may be plotted or used as input to an analysis algorithm, including jitter trends and histograms, eye diagrams, crosstalk analysis, power fidelity or any other analysis package.

Figure 3B:
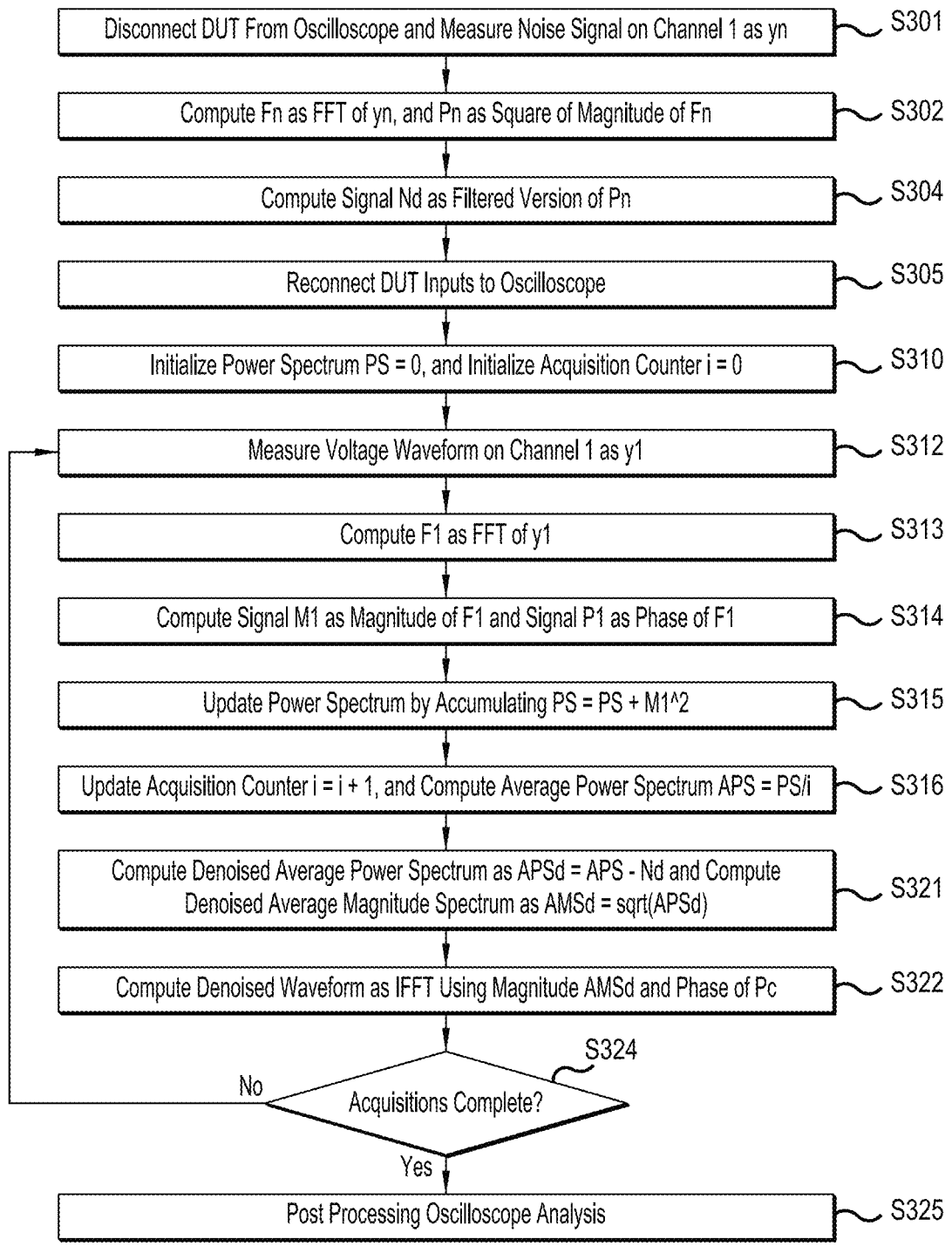
FIG. 3B illustrates a method for noise reduction of oscilloscope waveforms, in accordance with a representative embodiment.

FIG. 3B illustrates a method for noise reduction of oscilloscope waveforms, in accordance with a representative embodiment. The method of FIG. 3B is similar to the method of FIG. 3A, and overlapping features are not always repeated for the save of brevity. The method of FIG. 3B may be performed by the system 100 in FIG. 1A. In this embodiment, however, the power splitter is removed, and the DUT is connected directly to the oscilloscope at 110, which may be referred to by example as channel 1.

The method of FIG. 3B starts with disconnecting the DUT 10 from the oscilloscope (e.g., the system 100) and measuring the noise signal on channel 1 as yn at S301. The method of FIG. 3B also ends at S325 with post processing oscilloscope analysis. However, instead of computing the scalar Nd as an expected value of the noise power Pn of the oscilloscope at S303 as in FIG. 3A, at S304 the signal Nd is computed as a filtered version of the noise power Pn of the oscilloscope. For example, a trend-preserving vector approximation, such as by a low pass filter, median filter, or curve fit may be applied to filter out spurious components of Pn, or Pn may be used directly in which case Nd=Pn In embodiments based on FIG. 3A or FIG. 3B, the signal is not split onto two separate oscilloscope channels during the active testing process. Instead, only one channel is required, which matches a workflow frequently used for oscilloscopes, and which may sometimes be the only option.

In embodiments based on FIG. 3a and FIG. 3B, the incoming signal does not have to be split into two channels. Instead, only the DUT spectrum F1 is computed, where F1 is the Fourier transform of y1. Multiple acquisitions are taken to obtain a progressively improved estimation of the average power spectrum APS, and a constant or signal proportional to the noise of the oscilloscope is again subtracted. The shrinkage, or reduced spectrum APSd=APS−Nd is computed, where Nd is an estimate of the scope noise on channel 1. An advantage to using embodiments based on FIG. 3A or FIG. 3B is relative simplicity in that the signal does not have to be split into two separate paths and this avoids disruptions which can otherwise introduce errors due to cables not being completely matched, and due to non-ideal connectors. However, an advantage to using embodiments based on FIG. 2A or FIG. 2B is that in FIG. 3A and FIG. 3B the noise magnitude on channel 1 must be estimated, and this requires a calibration step. While calibration is currently an accepted practice, it may be avoided by using embodiments based on FIG. 2A or FIG. 2B.

FIG. 4 illustrates comparative average power spectrums for a common mode signal in noise reduction of oscilloscope waveforms, in accordance with a representative embodiment.

FIG. 4 shows an example of the average power spectrum for yc, after 1 acquisition, and again after 25 acquisitions, such as when the method of FIG. 2A or FIG. 2B is repeated 25 times. The spikes shown in FIG. 4 represent periodic components in the data of the radio frequency signals from the DUT 10. The noise "floor", the flat portion of the spectrum for yc, represents noise from both DUT and oscilloscope. For Gaussian noise the noise will have a constant value across all frequencies. The noise spectrum becomes more precise with more acquisitions.

FIG. 5 illustrates comparative average power spectrums for a differential mode signal in noise reduction of oscilloscope waveforms, in accordance with a representative embodiment.

FIG. 5 shows an example of the average power spectrum for yd=(ys1−ys2)/sqrt(2). The differential mode signal yd only contains noise contributions from the oscilloscope and Pd is the magnitude squared of the Fourier transform of yd. The magnitude of Pd is proportional only to combined oscilloscope noise, Nd. FIG. 5 shows an example of the average power spectrum Pd for yd after 1 acquisition, and again after 25 acquisitions, such as if the method of FIG. 2A or FIG. 2B is repeated 25 times.

FIG. 6 illustrates a noise-reduced average power spectrum in noise reduction of oscilloscope waveforms, in accordance with a representative embodiment.

FIG. 6 shows the noise-reduced average power spectrum after removing the oscilloscope noise Nd by simply subtracting Nd from the first power spectrum, APS. In other words, in FIG. 6 a new power spectrum, APSd=APS−Nd is formed, and the new spectrum explicitly lowers the "noise floor" of APS, and the new power spectrum APSd no longer has oscilloscope noise. In FIG. 2A and FIG. 2B, the square root of the power spectrum APSd is combined with the phase of y1, and the inverse Fourier transform is computed on this combination to obtain a noise-reduced waveform. The power spectra are averaged for each acquisition but the phase is of the most recent acquisition yi. The noise floor in FIG. 6 may not be smooth at first. Additionally, terms smaller than zero may be truncated to zero, even though this may distort the spectrum of APSd in individual instances but the noise floor becomes smoother as more acquisitions are performed.

Additionally, the power spectra Pd and Pn may not be a constant, even after acquiring more data, because the oscilloscope noise power may not be the same at all frequencies. Oscilloscope noise power may be stronger in some frequency bands than in others. Also, the power spectra Pd and Pn may not be flat due to oscilloscope pre-processing such as filtering or interpolation. These natural variations influence the trend, or slowly vary part of the spectrum. In a variation of the method of FIG. 2A, these terms are preserved in the method of FIG. 2B by computing the new spectrum as APSd=APS−Pd, or in other words, by subtracting off the whole spectrum Pd, rather than its estimated scalar magnitude, Nd. In a variation of the methods of FIG. 3A, these terms are preserved in the method of FIG. 3B by computing the new spectrum as APSd=APS−Pn. However, in the method of FIG. 2A, the spectrum Pd may not be flat if channel 1 and channel 2 are not perfectly aligned and the signal y from the DUT 10 will not be perfectly cancelled in the subtraction y1−y2. In other words, yd, and hence Pd, may contain DUT frequency components, such as spikes due to periodic components in the data. One way to preserve the trend, or natural noise variation with frequency, due to mismatches in alignment between y1 and y2, or due to any other scope pre-processing or measurement properties, while at the same time ignoring periodic terms, is to filter the spectra Pd and Pn. Filtering as in FIG. 2B and FIG. 3B may be performed by a variety of methods. In one approach, a moving average or a median filter is applied to Pd and/or Pn, to filter out periodic components, while preserving the trend. To summarize, in the basic methods of FIG. 2A and FIG. 3A, the new spectrum APSd=APS−Nd is computed, where Nd is determined as the constant magnitude of spectrum Pd. In the variation of FIG. 2B, the new spectrum APSD=APS−Pd is formed, and in the variation of FIG. 3B, the new spectrum APSD=APS−Pn is formed, or in other words, the two spectra are subtracted directly. In another variation of FIG. 2B, the new spectrum Nd=Pd−g(Pd), where g is an operator, such as a filter, wherein g may be a median filter, and in another variation of FIG. 3B, the new spectrum Nd=Pn−g(Pn), where g is an operator.

Figure 7:
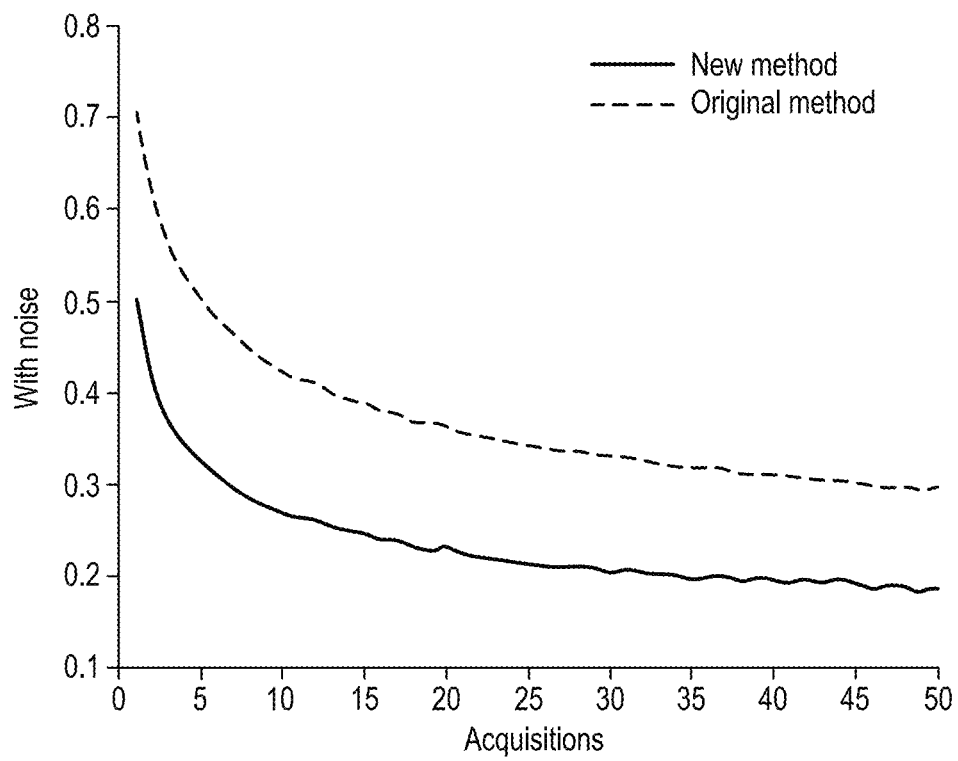
FIG. 7 illustrates comparative noise magnitudes in noise reduction of oscilloscope waveforms, in accordance with a representative embodiment.

FIG. 7 illustrates comparative noise magnitudes in noise reduction of oscilloscope waveforms, in accordance with a representative embodiment.

FIG. 7 shows convergence for a worst-case scenario: when the noise of the oscilloscope is 1, and the noise of the radio frequency signal from the DUT 10 is zero.

Because only oscilloscope noise is present in the worst-case scenario of zero DUT noise, the algorithm must try to remove all the noise, which is difficult. However, as shown in FIG. 7, the methods of FIG. 2A and FIG. 2B converge to 0 more quickly compared to previous methodologies, as data is acquired. The advantage reflected in FIG. 7 can be extended to more channels. In a 4 channel system, for example, yc=y1+y2+y3+y4 may be computed, which improves performance due to averaging out the oscilloscope noise. The difference signal in this case, is not as well-defined, but one approach is to compute yd=(y1−y2)+(y3−y4), which is an average of differences. This approach will converge faster than the two channel approach, at the expense of increased complexity.

Accordingly, noise reduction of oscilloscope waveforms enables removal of oscilloscope noise from a measured waveform from a DUT, while still leaving the DUT noise which is the target of the measurement by the oscilloscope. As a result, the noise floor of the oscilloscope may be effectively lowered through software and accuracy of oscilloscope measurements may be improved.

As described herein, oscilloscope noise may be removed from a measured waveform from a device under test (DUT), while still leaving the noise in the radio frequency signal from the DUT10 which is the target of the measurement by the oscilloscope. Results of removing the oscilloscope noise include effectively lowering the noise floor of the oscilloscope through software and improving accuracy of oscilloscope measurements.

Although noise reduction of oscilloscope waveforms has been described with reference to several exemplary embodiments, it is understood that the words that have been used are words of description and illustration, rather than words of limitation. Changes may be made within the purview of the appended claims, as presently stated and as amended, without departing from the scope and spirit of noise reduction of oscilloscope waveforms in its aspects. Although noise reduction of oscilloscope waveforms has been described with reference to particular means, materials and embodiments, noise reduction of oscilloscope waveforms is not intended to be limited to the particulars disclosed; rather noise reduction of oscilloscope waveforms extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

I claim:

1. An oscilloscope, comprising:
a memory that stores instructions; and
a processor that executes the instructions, wherein, when executed by the processor, the instructions cause the oscilloscope to:
obtain a measurement of a first radio frequency signal;
perform a first Fourier transform to compute a first new spectrum based on the measurement of the first radio frequency signal; and
compute a first waveform of the first new spectrum with noise of the oscilloscope reduced by performing a first inverse Fourier transform based on the first new spectrum.

2. The oscilloscope of claim 1, wherein, when executed by the processor, the instructions further cause the oscilloscope to:
obtain a measurement of a second radio frequency signal;
perform the first Fourier transform to compute the first new spectrum based on the measurement of the first radio frequency signal and the measurement of the second radio frequency signal, wherein the first new spectrum is of a first common mode signal based on the first radio frequency signal and the second radio frequency signal; and
measure a contribution of the oscilloscope to noise of the first common mode signal by performing a second Fourier transform of a differential mode signal based on the first radio frequency signal and the second radio frequency signal.

3. The oscilloscope of claim 2, wherein, when executed by the processor, the instructions further cause the oscilloscope to:
combine a magnitude of the first new spectrum of the first common mode signal and a phase of the first radio frequency signal; and
compute the first waveform of the first new spectrum of the first common mode signal with noise of the oscilloscope reduced by performing the first inverse Fourier transform based on the magnitude of the first new spectrum of the first common mode signal and the phase of the first radio frequency signal.

4. The oscilloscope of claim 3, wherein, when executed by the processor, the instructions further cause the oscilloscope to:
obtain a measurement of a third radio frequency signal and a measurement of a fourth radio frequency signal;
perform a third Fourier transform to compute a second new spectrum based on the measurement of the third radio frequency signal and the measurement of the fourth radio frequency signal, wherein the second new spectrum is of a second common mode signal based on the third radio frequency signal and the fourth radio frequency signal;
measure a contribution of the oscilloscope to noise of the second common mode signal by performing a fourth Fourier transform of a differential mode signal based on the third radio frequency signal and the fourth radio frequency signal;
combine a magnitude of the second new spectrum of the second common mode signal and a phase of the third radio frequency signal; and
compute a second waveform of the second new spectrum with noise of the oscilloscope reduced by performing a second inverse Fourier transform based on the magnitude of the second new spectrum of the second common mode signal and the phase of the third radio frequency signal.

5. The oscilloscope of claim 4, wherein, when executed by the processor, the instructions further cause the oscilloscope to:
average the first new spectrum and the second new spectrum.

6. The oscilloscope of claim 1, wherein, when executed by the processor, the instructions further cause the oscilloscope to:
estimate a contribution of the oscilloscope to noise of the first radio frequency signal based on the first radio frequency signal; and
perform the first Fourier transform to compute the first new spectrum based on the measurement of the first radio frequency signal and the estimated contribution of the oscilloscope to the noise of the first radio frequency signal.

7. The oscilloscope of claim 6, wherein, when executed by the processor, the instructions further cause the oscilloscope to:
combine a magnitude of the first new spectrum and a phase of the first radio frequency signal; and
compute the first waveform of the first new spectrum with noise of the oscilloscope reduced by performing the first inverse Fourier transform based on the magnitude of the first new spectrum and the phase of the first radio frequency signal.

8. The oscilloscope of claim 7, wherein, when executed by the processor, the instructions further cause the oscilloscope to:
obtain a measurement of a second radio frequency signal;
perform a second Fourier transform to compute a second new spectrum based on the measurement of the second radio frequency signal;

compute a second waveform of the second new spectrum with noise of the oscilloscope reduced by performing a second inverse Fourier transform based on the second new spectrum;
estimate a contribution of the oscilloscope to noise of the second radio frequency signal based on the second radio frequency signal;
perform the second Fourier transform to compute the second new spectrum based on the measurement of the second radio frequency signal and the estimated contribution of the oscilloscope to noise of the second radio frequency signal;
combine a magnitude of the second new spectrum and a phase of the second radio frequency signal; and
compute the second waveform of the second new spectrum with noise of the oscilloscope reduced by performing the second inverse Fourier transform based on the magnitude of the second new spectrum and the phase of the second radio frequency signal.

9. The oscilloscope of claim 8, wherein, when executed by the processor, the instructions further cause the oscilloscope to:
average the first new spectrum and the second new spectrum.

10. The oscilloscope of claim 1, wherein, when executed by the processor, the instructions further cause the oscilloscope to:
filter a noise spectrum of the oscilloscope before computing the first new spectrum.

11. The oscilloscope of claim 1, further comprising:
a user interface that provides an option to denoise the first radio frequency signal.

12. A tangible non-transitory computer-readable storage medium that stores a computer program, wherein the computer program, when executed by a processor, causes a system to:
obtain a measurement of a first radio frequency signal;
perform a first Fourier transform to compute a first new spectrum based on the measurement of the first radio frequency signal; and
compute a first waveform of the first new spectrum with noise of the system reduced by performing a first inverse Fourier transform based on the first new spectrum.

13. The tangible non-transitory computer-readable storage medium of claim 12, wherein, when executed by the processor, the computer program further causes the system to:
obtain a measurement of a second radio frequency signal;
perform the first Fourier transform to compute the first new spectrum based on the measurement of the first radio frequency signal and the measurement of the second radio frequency signal, wherein the first new spectrum is of a first common mode signal based on the first radio frequency signal and the second radio frequency signal; and
measure a contribution of the system to noise of the first common mode signal by performing a second Fourier transform of a differential mode signal based on the first radio frequency signal and the second radio frequency signal.

14. The tangible non-transitory computer-readable storage medium of claim 13, wherein, when executed by the processor, the computer program further causes the system to:
combine a magnitude of the first new spectrum of the first common mode signal and a phase of the first radio frequency signal;
compute the first waveform of the first new spectrum of the first common mode signal with noise of the system reduced by performing the first inverse Fourier transform based on the magnitude of the first new spectrum of the first common mode signal and the phase of the first radio frequency signal;
obtain a measurement of a third radio frequency signal and a measurement of a fourth radio frequency signal;
perform a third Fourier transform to compute a second new spectrum based on the measurement of the third radio frequency signal and the measurement of the fourth radio frequency signal, wherein the second new spectrum is of a second common mode signal based on the third radio frequency signal and the fourth radio frequency signal;
measure a contribution of the system to noise of the second common mode signal by performing a fourth Fourier transform of a differential mode signal based on the third radio frequency signal and the fourth radio frequency signal;
combine a magnitude of the second new spectrum of the second common mode signal and a phase of the third radio frequency signal; and
compute a second waveform of the second new spectrum with noise of the system reduced by performing a second inverse Fourier transform based on the magnitude of the second new spectrum and the phase of the third radio frequency signal.

15. The tangible non-transitory computer-readable storage medium of claim 14, wherein, when executed by the processor, the computer program further causes the system to:
average the first new spectrum and the second new spectrum.

16. The tangible non-transitory computer-readable storage medium of claim 12, wherein, when executed by the processor, the computer program further causes the system to:
estimate a contribution of the system to noise of the first radio frequency signal based on the first radio frequency signal; and
perform the first Fourier transform to compute the first new spectrum based on the measurement of the first radio frequency signal and the estimated contribution of the system to noise of the first radio frequency signal.

17. The tangible non-transitory computer-readable storage medium of claim 16, wherein, when executed by the processor, the computer program further causes the system to:
combine a magnitude of the first new spectrum and a phase of the first radio frequency signal; and
compute the first waveform of the first new spectrum with noise of the system reduced by performing the first inverse Fourier transform based on the magnitude of the first new spectrum and the phase of the first radio frequency signal.

18. The tangible non-transitory computer-readable storage medium of claim 17, wherein, when executed by the processor, the computer program further causes the system to:
obtain a measurement of a second radio frequency signal;

perform a second Fourier transform to compute a second new spectrum based on the measurement of the second radio frequency signal;

compute a second waveform of the second new spectrum with noise of the system reduced by performing a second inverse Fourier transform based on the second new spectrum;

estimate a contribution of the system to noise of the second radio frequency signal based on the second radio frequency signal;

perform the second Fourier transform to compute the second new spectrum based on the measurement of the second radio frequency signal and the estimated contribution of the system to noise of the second radio frequency signal;

combine a magnitude of the second new spectrum and a phase of the second radio frequency signal; and compute the second waveform of the second new spectrum with noise of the system reduced by performing the second inverse Fourier transform based on the magnitude of the second new spectrum and the phase of the second radio frequency signal.

19. The tangible non-transitory computer-readable storage medium of claim 18, wherein, when executed by the processor, the computer program further causes the system to:

average the first new spectrum and the second new spectrum.

20. A system, comprising:

a memory that stores instructions; and a processor that executes the instructions, wherein, when executed by the processor, the instructions cause the system to:

obtain a measurement of a first radio frequency signal;

perform a first Fourier transform to compute a first new spectrum based on the measurement of the first radio frequency signal; and compute a first waveform of the first new spectrum with noise of the system reduced by performing a first inverse Fourier transform based on the first new spectrum.

* * * * *